United States Patent [19]

Rozanski et al.

[11] Patent Number: 4,875,137
[45] Date of Patent: Oct. 17, 1989

[54] UNIFORM CURRENT AND VOLTAGE DISTRIBUTION DEVICE

[75] Inventors: Robert D. Rozanski, Huntington Beach; James R. Medlock, III, West Covina; Stephen F. Larson, La Habra Heights, all of Calif.

[73] Assignee: L.E.A. Dynatech, Santa Fe Springs, Calif.

[21] Appl. No.: 295,379

[22] Filed: Jan. 10, 1989

[51] Int. Cl.$^4$ .......................... H02B 1/00; H05K 1/16
[52] U.S. Cl. .................................. 361/331; 361/404; 361/409
[58] Field of Search ............... 361/331, 332, 334, 407, 361/409, 404, 406

[56] References Cited

U.S. PATENT DOCUMENTS

| | | |
|---|---|---|
| 3,487,268 | 12/1969 | Ljungdell et al. .................. 361/406 |
| 3,524,107 | 8/1970 | Reitz . |
| 3,917,982 | 11/1975 | George et al. . |
| 3,983,311 | 9/1976 | Brumfield et al. .................. 361/334 |
| 4,298,770 | 11/1981 | Nishihara et al. .................. 361/409 |
| 4,396,970 | 8/1983 | Scudner, Jr. . |
| 4,635,160 | 1/1987 | Riley . |

Primary Examiner—Roy N. Envall, Jr.
Attorney, Agent, or Firm—Oliff & Berridge

[57] ABSTRACT

A device for uniformily distributing current and voltage comprises first and second terminals, a first electrical bus electrically connected to the first terminal, a second electrical bus electrically isolated from the first electrical bus and electrically connected to the second terminal, a plurality of electrical components connected between the first and second buses so as to form a plurality of circuit paths of equal length, each circuit path running between the first terminal, the first electrical bus, one of the circuit components, the second electrical bus, and the second terminal. The plurality of electrical components are connected to the first and second buses at locations which are equidistant from the first and second terminals, respectively.

21 Claims, 3 Drawing Sheets

UNIFORM CURRENT AND VOLTAGE DISTRIBUTION DEVICE

BACKGROUND

The present invention relates in general to voltage and current distribution devices, and more particularly to such devices which are capable of uniformly distributing current and voltage to a plurality of individual electrical circuit components.

Uniform or balanced distribution of current and voltage is desirable in a variety of situations. One such situation involves transient voltage surge suppressor systems, wherein unequal power loading of multiple surge suppression components reduces the effectiveness of the system, and causes excessive stress on the more heavily loaded components, which results in premature failure of those components. However, prior surge suppression systems have not provided for uniform distribution of current and voltage to the individual components making up the system. For example, U.S. Pat. No. 4,635,160 to Riley discloses a transient voltage suppression assembly wherein each of a plurality of voltage suppression devices (VSDs) mounted on a grounded conductor plate is connected to a separate conductor extending through the assembly. Riley is concerned only with minimizing the parasitic inductance of each VSD, and no provision is made for providing a common voltage/current to the plural VSDs.

Another electrical protector assembly is disclosed in U.S. Pat. No. 3,917,982 to George et al. In the George et al. device, plural protective devices are mounted in longitudinally spaced sections of the assembly, and a shunt lead of each protective device is connected to a ground bus member extending beneath the protective devices. Consequently, the various protective devices have unequal circuit paths to ground.

SUMMARY OF THE INVENTION

It is therefore an object of the invention to provide a device which is capable of uniformly distributing current and voltage to a plurality of electrical circuit components.

It is another object of the invention to provide a uniform current and voltage distribution device which is easily and economically manufactured, reliable, rugged and easily maintained.

It is a still further object of the invention to provide a uniform current and voltage distribution device which is compatible with a wide range of possible applications and circuit components, including but not limited to transient voltage surge suppression.

These and other objects and advantages are achieved in accordance with the present invention by a uniform current and voltage distribution device which includes first and second terminals, a first electrical bus electrically connected to the first terminal, a second electrical bus electrically isolated from the first electrical bus and electrically connected to the second terminal, and a plurality of electrical components connected between the first and second buses so as to form a plurality of circuit paths of equal length, each circuit path running between the first terminal, the first electrical bus, one of the circuit components, the second electrical bus, and the second terminal.

In accordance with another aspect of the invention, the plurality of electrical components are connected to the first and second buses at locations which are equidistant from the first and second terminals, respectively.

In accordance with yet another aspect of the invention, in one embodiment the first terminal is part of the first bus, the second terminal is part of the second bus, the first and second buses are respectively disposed on separate first and second planar support members which are joined together in facing relationship, and the first support member has two sets of apertures, one set communicating with the first bus for permitting connection of one of the leads of each circuit component to a respective one of the connection locations on the first bus, and the second set of aperture permitting another of the leads of each circuit component to extend through the first support member for connection to the second bus.

In accordance with yet another aspect of the invention, in a second embodiment, the first bus comprises a first conductive member disposed on a support member, and the second bus comprises an annular second conductive member disposed on the same support member around the first conductive member and concentric therewith.

These and other features and advantages of the invention are described in or are apparent from the following detailed description of the preferred embodiments.

BRIEF DESCRIPTION OF THE DRAWING

The preferred embodiments are described with reference to the drawing in which.

DESCRIPTION OF THE PREFERRED EMBODIMENTS

Figure 1:
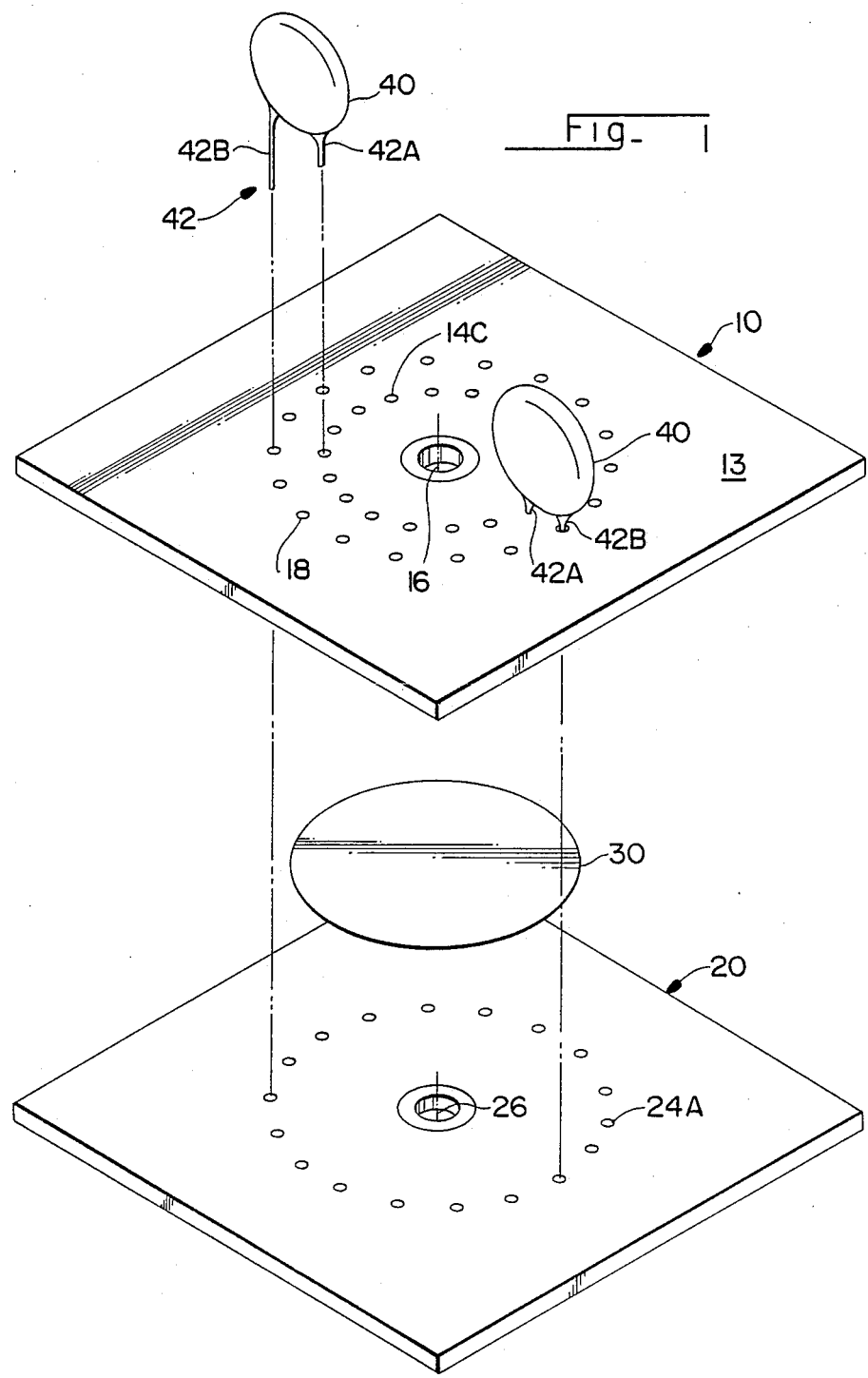
FIG. 1 is an exploded perspective view of a first embodiment of a uniform current and voltage distribution device constructed in accordance with the present invention.
Figure 2:
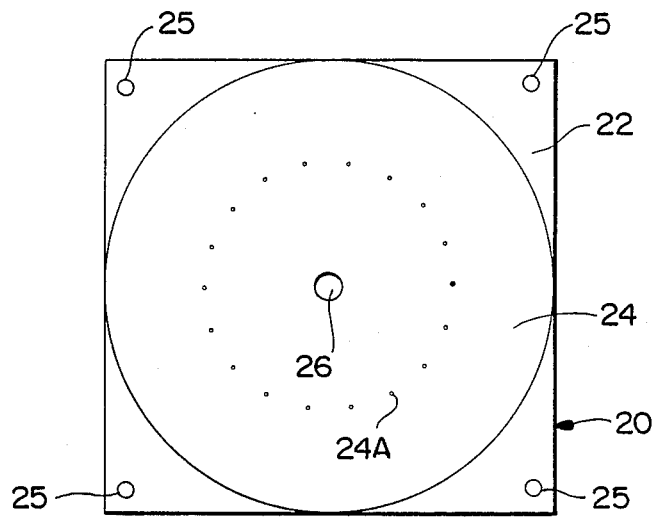
FIGS. 2 and 3 are respectively plan views of the bottom faces of portions of the embodiment of FIG. 1.
Figure 3:
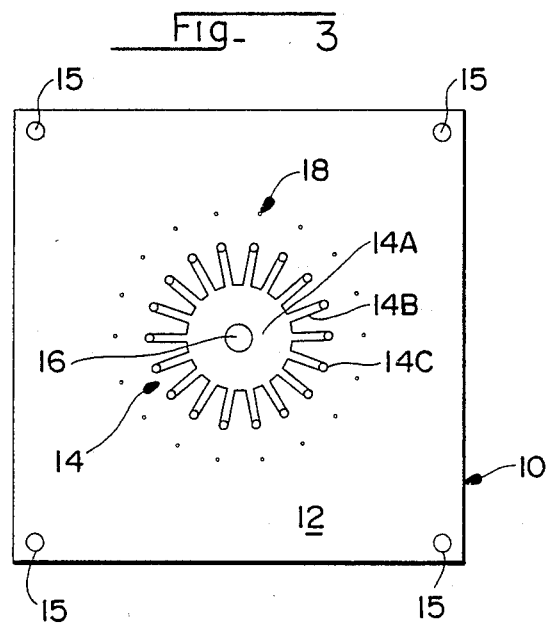

Referring to FIGS. 1-3, a first embodiment of a uniform current and voltage distributiion device constructed in accordance with the present invention comprises first and second electrically non-conductive support members 10 and 20, an intermediate insulator member 30 disposed therebetween, and a plurality of electrical circuit components 40 mounted on support members 10 and 20 in the manner described in more detail hereinafter. As shown, support members 10 and 20 preferably have a substantially planar, plate-like configuration, and are made from standard epoxy-glass printed circuit board material. Advantageously, one of the members 10, 20 can be an integral part of a larger printed circuit board containing other components. As shown, peripheral mounting holes 15 and 25 advantageously are respectively provided in support members 10 and 20 for physically securing the support members together with mechanical connectors (not shown). Alternatively, an adhesive or the like can be used to secure the support members.

Support members 10 and 20 have formed on their respective bottom faces 12 and 22 electrically conductive bus members 14 and 24 which include terminal members 16 and 26 for connection to conductors (not shown). Bus members 14 and 24 advantageously are layers of conductive material formed on the respective support members 10 and 20 by conventional printed circuit techniques. As shown, (FIG. 3) bus member 14 preferably has a spoke configuration comprising a central circular portion 14A and plurality of radially extending spokes 14B of equal length which each terminates in a connecting aperture 14C extending through support member 10. Spokes 14B advantageously are dimensioned so as to function as fuses having a predetermined current rating which "blow" when the current passing through bus member 14 exceeds the rating limit. It will be appreciated that bus member 14 alternatively may have a circular or other geometric configuration which does not include spokes. As shown, terminal member 16 is disposed at the center of bus member 14 and advantageously is in the form of a circular aperture in support member 10 to facilitate connection of a conductor thereto.

As shown (FIG. 2), bus member 24 preferably has a circular configuration with terminal 26 formed at the center thereof, and a ring of apertures 24A concentric with terminal 26 extending through support member 20. Terminal 26 advantageously has the same circular aperture form as terminal 16.

As shown, support member 10 includes a further ring of apertures 18 concentric with terminal 16 and having the same diameter and circumferential spacing of the apertures as the ring of apertures 24A on support member 20. Further, apertures 14C of bus member 14 are respectively radially aligned with corresponding ones of apertures 18, and the difference between the radius of the ring formed by apertures 14C and the radius of the rings of apertures 18 and 24A corresponds to the spacing between the connecting leads 42 of electrical circuit components 40. Insulator member 30 preferably has a circular configuration, as shown, with a radius greater than that of the ring of apertures 14C but less than that of the rings of apertures 18 and 24A.

As shown, electrical circuit components 40, which may be any type of circuit component, for example, a voltage surge suppression device such as a metal oxide varistor (MOV) or the like, are mounted on the top face 13 of support member 10. One lead 42A of each circuit component 40 extends through one of the apertures 14C of bus member 14 and is electrically joined, e.g., by soldering or the like, to the associated spoke 14B of bus member 14. The other lead 42B of each circuit component 40 extends through the associated aligned aperture 98 of support member 10, and through aperture 24A in support member 20, and is electrically connected to bus member 24. It will be appreciated that the present invention can be used with multi-lead circuit components having more than two heads. For example, two of the leads of such a component may be connected to the respective bus members in the manner shown, with the additional leads connected either to further bus members or to individual circuit conductors as desired.

It will be appreciated by those of ordinary skill in the art from the foregoing that a plurality of circuit paths of equal length are formed, running between terminal 16, bus member 14, each circuit component 40, bus member 24, and terminal 26, so that voltage and current applied to either terminal can be equally distributed to the plurality of circuit components.

Figure 5:
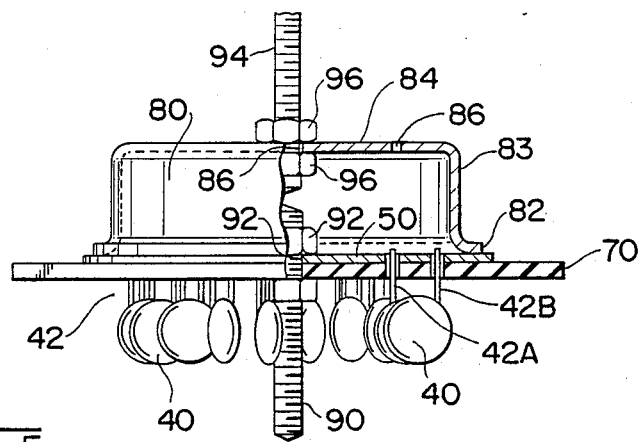
FIG. 5 is an elevation view of the embodiment of FIG. 4, with a partial cross-section taken along the line 5—5 of FIG. 4.
Figure 4:
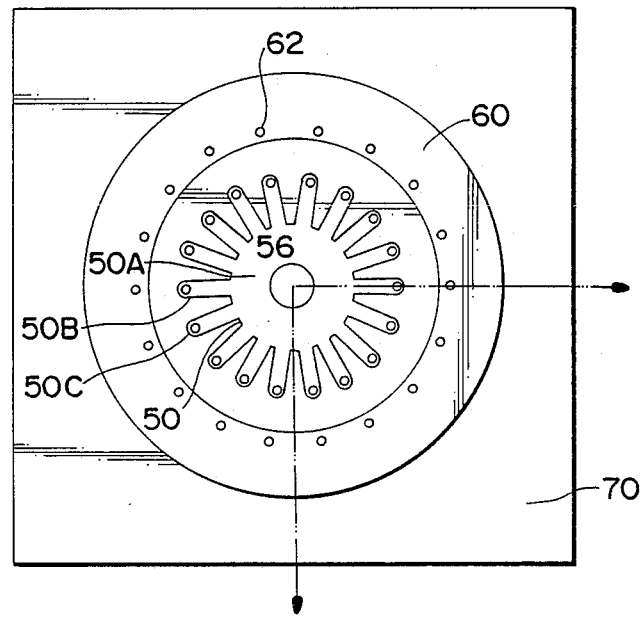
FIG. 4 is a plan view of a portion of a second embodiment of a uniform current and voltage distribution device constructed in accordance with the present invention.

Referring now to FIGS. 4 and 5, a second embodiment of a uniform current and voltage distribution device constructed in accordance with the present invention will now be described. As shown, the second embodiment comprises a generally circular electrically conductive member 50 and an annular electrically conductive member 60 coaxially mounted on an electrically nonconductive substrate 70. Similarly to the first embodiment described hereinabove, substrate 70 is made from standard printed circuit board material and can be an integral part of a larger printed circuit board containing other components. In addition, conductive members 50 and 60 similarly advantageously are conductive layers formed on substrate 70 by conventional printed circuit techniques. An electrically conductive, substantially cylindrical cap member 80 extends above substrate 70 is electrically connected at its flanged rim 82 to an outer periphery of the annular member 60 by soldering or other conventional means. Cap member 80 includes a top portion 84, with optional vent holes 86, which preferably is formed as an integral part of cap member 80, as shown, but which may be separately formed and electrically connected to the vertical wall 83 of cap member 80.

As shown, conductive member 50 has the same configuration as bus member 14 in the first embodiment, and accordingly will not be described in detail other than to note that a conductor 90 in the form of a threaded rod is shown in FIG. 5 mounted in the connecting terminal aperture 56 and secured and electrically connected to conductive member 50 by means of two nuts 92 disposed on opposite sides of substrate 70. Conductive member 60 has a ring of apertures 62 extending through substrate 70. Similarly to the first embodiment, apertures 62 are radially aligned with corresponding ones of the apertures 50C formed in conductive member 50, and the difference in the respective radii of the two rings of apertures corresponds ot the spacing beetween the leads 42 of the electrical components 40 connected between the conductive members. Preferably, as shown, the ring of apertures 62 is formed at the inner periphery of conductive member 60.

Cap member 80 also has a centrally located connecting terminal 86 in the form of a circular aperture which is preferably coaxially aligned with terminal aperture 56 of conductive member 50. A conductor 94 similar to conductor 90 is also shown mounted to terminal 86 and electrically connected to a cap member 80 by two nuts 96 in the same fashion as conductor 90.

Similarly to the first embodiment, one lead 42A of each circuit component 40 extends through one of the apertures 50C and is electrically joined, e.g., by soldering or the like, to the associated spoke 50B of conductive member 50; and the other lead 42B of each circuit component 40 extends through the associated aligned aperture 62 and is similarly electrically connected to conductive member 60. It will be appreciated that while circuit components 40 are shown as depending from the bottom face of substrate 70, they may also mounted so as to project from the top face of substrate 70 and to be housed within cap member 80. It will also be appreciated that conductive members 50 and 60 can alternatively be provided with connecting pins or nodules (not shown) to which the circuit component leads are attached.

As is apparent from the foregoing, conductive member 50 of the present embodiment corresponds in function to bus member 14 of the first embodiment, while conductive member 60 and cap member 80 together correspond to bus member 24. Hence, as in the first embodiment, the second embodiment provides a plurality of circuit paths of equal length, running between terminal 86, cap member 80, conductive member 60, each circuit component 40, conductive member 50 and terminal 56, so that voltage and current applied to either terminal can be equally distributed to the plurality of circuit components.

Figure 6:
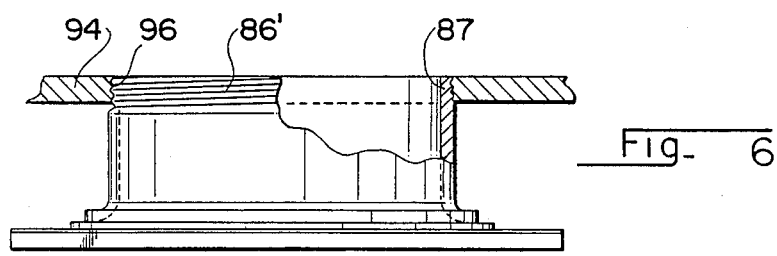
FIG. 6 is an elevation view, partly cut away, of a third embodiment of the present invention.

An alternative embodiment of the present invention is depicted in FIG. 6. This embodiment is identical to the second embodiment depicted in FIGS. 4 and 5, except that cap member 80 includes a threaded portion 87 at its distal end for engagement with a mating hole 96 in a plate form of conductor 94, such that the engaging periphery of cap member constitutes the connecting terminal 86'. Of course, cap member 80 in this embodiment may also be electrically connected to conductor plate 94 by soldering or other conventional means in lieu of the threaded connection, or may be integrally formed as part of a conductor.

It will be appreciated from the foregoing that the exceptionally simple design of the uniform current and voltage distribution devices of the present invention is readily and economically manufactured, and provides a rugged and reliable device. The present invention is particularly adapted to provide uniform current and voltage distribution to more than two electrical components. However, the number of circuit components 40 which may be utilized with the present invention is determined from the requirements of a specific application. Thus, although embodiments have been illustrated which permit a maximum of eighteen components, it will be fully appreciated from the above disclosure that the device may be configured to provide for uniform distribution of current and voltage through any number of components. (It is noted that laboratory tests performed on transient voltage suppression assemblies constructed with eighteen metal oxide varistors serving as the circuit components demonstrated safe accommodation of typical loads in varying quantities through 100 kA within a time period of 50 $\mu$s.)

It will be appreciated from the foregoing that the present invention is not limited to embodiments in which the connection locations on the respective bus members for the circuit component leads have a circular arrangement, or are equidistantly spaced from each other, or are symmetrically disposed with respect to the corresponding terminals of the uniform current and voltage distribution device.

Many other applications of the uniform current and voltage distribution device of the present invention will be apparent to those of ordinary skill in the art from the foregoing disclosure. In addition, many modifications and variations to the disclosed uniform current and voltage distribution devices are possible in light of the above teachings. It is to be understood that, within the scope of the appended claims, the invention may be practiced otherwise then as specifically shown and described without departing from the spirit and scope of the invention.

What is claimed is:

1. A uniform current and voltage distribution device comprising:
   first terminal means;
   second terminal means;
   first electrical bus means electrically connected to said first terminal means;
   second electrical bus means electrically isolated from said first electrical bus means and electrically connected to said second terminal means; and
   a plurality of electrical circuit components connected between said first and second bus means so as to form a plurality of circuit paths of equal length, each circuit path running between said first terminal means, said first electrical bus means, a corresponding one of said electrical components, said second electrical bus means, and said second terminal means.

2. The device of claim 1 wherein said electrical circuit components are connected to said first electrical bus means at spaced locations equidistant from said first terminal means.

3. The device of claim 2 wherein said electrical circuit components are connected to said second electrical bus means at spaced locations equidistant from said second terminal means.

4. The device of claim 3 wherein said first and second electrical bus means each comprise unitary conductive members.

5. The device of claim 3 wherein said first terminal means is part of said first electrical bus means and said second terminal means is part of said second electrical bus means.

6. The device of claim 5 wherein said connection locations of said electrical circuit components to said first electrical bus means are radially equidistant from said first terminal means, and said connection locations of said electrical circuit components to said second electrical bus means are radially equidistant from said second terminal means.

7. The device of claim 6 wherein said first and second terminal means are coaxial.

8. The device of claim 7 wherein said first and second terminal means respectively comprise an aperture in said first and second electrical bus means, respectively.

9. The device of claim 6 wherein said first electrical bus means is disposed on a first planar support member, said second electrical bus means is disposed on a second planar support member, and said first and second support members are joined together in facing relationship.

10. The device of claim 9 wherein said first and second electrical bus means each comprise a layer of electrically conductive material on one face of the corresponding support member; said circuit components each have first and second electrical connecting leads; said first support member includes a plurality of first apertures therein concentric with said first terminal means and in communication with said first electrical bus means for permitting connection of said respective first electrical connecting leads of said circuit components to corresponding ones of said first electrical bus means connection locations; and said first support member includes a plurality of second apertures therein concentric with said first terminal means at a greater radial distance from said first terminal means than said first apertures so as to be spaced from said first electrical bus means for permitting said second electrical connecting leads of said circuit components to extend through corresponding ones of said second apertures for connection to said second electrical bus means.

11. The device of claim 10 wherein said second support member includes a plurality of third apertures formed therein in alignment with said second apertures and in communication with said second electrical bus means.

12. The device of claim 11 wherein said first electrical bus means comprises a central circular portion and a plurality of radially extending spokes to which said electrical circuit components are respectively connected.

13. The device of claim 12 wherein said spokes are dimensioned so as to function as fuses having a predetermined current rating.

14. The device of claim 11 wherein a circular insulator member is disposed between said first and second support members.

15. The device of claim 14 wherein the radius of said insulator member is greater than the radial distance of said first apertures from said first terminal means and less than the radial distance of said second apertures from said first terminal means.

16. The device of claim 6 wherein said first electrical bus means comprises a first conductive member disposed on a support member, and said second electrical bus means comprises an annular second conductive member disposed on said support member around said first conductive member and concentric therewith.

17. The device of claim 16 wherein said electrical circuit components are connected between said first and second conductive members, and said second electrical bus means comprises an upstanding cylindrical member having a first end connected to said second conductive member coaxially with said first terminal means and a second end connected to said second terminal means.

18. The device of claim 17 wherein said cylindrical means has a cap portion at the center of which is located said second terminal means.

19. The device of claim 18 wherein said second end of said cylindrical conductive member constitutes said second terminal means.

20. The device of claim 15 wherein transient voltage suppression devices constitute said electrical circuit components.

21. The device of claim 20 wherein transient voltage suppression devices constitute said electrical circuit components.

* * * * *